United States Patent
Wang et al.

(10) Patent No.: US 9,285,646 B2
(45) Date of Patent: Mar. 15, 2016

(54) DISPLAY PANEL AND DISPLAY DEVICE

(71) Applicant: BOE TECHNOLOGY GROUP CO., LTD., Beijing (CN)

(72) Inventors: Yingtao Wang, Beijing (CN); Haoliang Zheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 58 days.

(21) Appl. No.: 14/495,149

(22) Filed: Sep. 24, 2014

(65) Prior Publication Data
US 2015/0346536 A1  Dec. 3, 2015

(30) Foreign Application Priority Data
Jun. 3, 2014  (CN) .......................... 2014 1 0243003

(51) Int. Cl.
*G02F 1/137* (2006.01)
*G02F 1/1347* (2006.01)
*G02F 1/1335* (2006.01)
*H01L 27/32* (2006.01)
*G02F 1/13363* (2006.01)
*G02F 1/1333* (2006.01)

(52) U.S. Cl.
CPC ........ G02F 1/13725 (2013.01); G02F 1/13362 (2013.01); G02F 1/133528 (2013.01); *G02F 1/13475* (2013.01); *G02F 2001/133342* (2013.01); *G02F 2001/133541* (2013.01); *G02F 2001/133616* (2013.01); *G02F 2001/133638* (2013.01); *H01L 27/3267* (2013.01)

(58) Field of Classification Search
CPC ............ G02F 1/13475; G02F 1/13725; G02F 1/13737; G02F 1/13362; G02F 2001/133638; G02F 2001/133342; G02F 2001/133541; C09K 19/60; H01L 27/3267
USPC ...................................................... 349/115, 98
See application file for complete search history.

(56) References Cited

U.S. PATENT DOCUMENTS

2012/0176301 A1* 7/2012 Gibson ............... G02F 1/13762
345/88

FOREIGN PATENT DOCUMENTS

CN  105122123 A  * 12/2015  .......... G02F 1/13475

* cited by examiner

*Primary Examiner* — Michael Caley
*Assistant Examiner* — Jia Pan
(74) *Attorney, Agent, or Firm* — Harness, Dickey & Pierce, P.L.C.

(57) ABSTRACT

A display panel provided according to the present disclosure may include an optical component and two Guest Host liquid crystal cells located at two opposite sides of the optical component. The optical component is used for reflecting light with a specific wavelength and transmitting other light. The Guest Host liquid crystal cells each include a plurality of pixel units each having two operation states of transmitting natural light and linearly polarized light. When the pixel units transmit the linearly polarized light, the light reflected by the optical component cannot pass through the pixel units, thereby achieving a dark state display.

20 Claims, 6 Drawing Sheets

DISPLAY PANEL AND DISPLAY DEVICE

CROSS-REFERENCE TO RELATED APPLICATION

The present application claims a priority of the Chinese patent application No. 201410243003.8 filed on Jun. 3, 2014, which is incorporated herein by reference in its entirety.

FIELD OF THE INVENTION

The present disclosure relates to a field of display technology, in particular to a display panel and a display device.

DESCRIPTION OF THE PRIOR ART

In recent years, with continuous improvement on Liquid Crystal Display (LCD) technology, LCD products gradually spread to every corner of our lives. People's requirements on characteristics of the LCD products, such as high contrast, high resolution, low power consumption, are increasingly demanding.

A reflective-type display panel has been proposed for low power consumption display technology. Such a reflective-type display panel may display under an ambient natural light condition without a backlight source. Therefore, the reflective-type display panel is more suitable for outdoor situations, e.g., may be applied to billboards, signposts and so on.

However, the reflection-type display panel may only use reflected light for achieving display, which has a low utilization of light. Thus, there is a technical problem of low brightness and low contrast.

SUMMARY OF THE INVENTION

The present disclosure provides a display panel and a display device for solving the above technical problem with the reflective-type display panel that the utilization of the light, the brightness and the contrast are low.

In order to solve the above technical problem, according to an aspect of the present disclosure, a display panel is provided. The display panel comprises:

an optical component for reflecting light with a specific wavelength and transmitting other light;

a first Guest Host (GH) liquid crystal cell and a second GH liquid crystal cell located at two opposite sides of the optical component, the first GH liquid crystal cell and the second GH liquid crystal cell each comprising a plurality of pixel units which have a first operation state and a second operation state, the pixel units transmitting natural light under the first operation state and transmitting linearly polarized light under the second operation state. When the pixel units are under the second operation state, a polarization direction of the light reflected by the optical component is substantially perpendicular to an extension direction of a polarization axis of the pixel units, thereby achieving a dark state display.

According to the display panel as described above, for example, the optical component comprises:

a cholesteric liquid crystal layer in a planar state for reflecting the light with the specific wavelength and transmitting the other light;

a first ¼ wave plate between the first GH liquid crystal cell and the cholesteric liquid crystal layer in an extension direction of a screw axis of the cholesteric liquid crystal layer; and a second ¼ wave plate between the second GH liquid crystal cell and the cholesteric liquid crystal layer in the extension direction of the screw axis of the cholesteric liquid crystal layer, wherein the first ¼ wave plate and the second ¼ wave plate are used for converting the linearly polarized light into circularly polarized light which has the same optical rotation characteristic as that of the cholesteric liquid crystal layer.

According to the display panel as described above, for example, under the second operation state, the polarization axes of the pixel units in the first GH liquid crystal cell and the second GH liquid crystal cell are substantially perpendicular to each other.

According to the display panel as described above, for example, a first front light source is arranged at one side of the first GH liquid crystal cell opposite to the cholesteric liquid crystal layer.

According to the display panel as described above, for example, a first asymmetric scattering film is arranged between the first front light source and the first GH liquid crystal cell.

According to the display panel as described above, for example, a second front light source is arranged at one side of the second GH liquid crystal cell opposite to the cholesteric liquid crystal layer.

According to the display panel as described above, for example, a second asymmetric scattering film is arranged between the second front light source and the second GH liquid crystal cell.

According to the display panel as described above, for example, structures of the first GH liquid crystal cell and the second GH liquid crystal cell are identical, each including:

a first substrate and a second substrate arranged opposite to form the cell;

a GH liquid crystal molecular layer arranged between the first substrate and the second substrate;

wherein a common electrode is arranged inside the first substrate, a pixel electrode is arranged inside the second substrate, each of the pixel units in the first GH liquid crystal cell and the second GH liquid crystal cell includes one pixel electrode, the pixel electrodes of adjacent pixel units are electrically insulated, and the pixel electrodes and the common electrode are used for controlling deflection of the GH liquid crystal molecules, so as to switch the corresponding pixel units to the first operation state or the second operation state.

According to the display panel as described above, for example, the cholesteric liquid crystal layer is a right-handed cholesteric liquid crystal layer; and wherein under the second operation state, an angle between the polarization axis of the pixel units of the first GH liquid crystal cell and an optical axis of the first ¼ wave plate is substantially 45°, and an angle between the polarization axis of the pixel units of the second GH liquid crystal cell and an optical axis of the second ¼ wave plate is substantially 45°.

According to the display panel as described above, for example, the cholesteric liquid crystal layer is a left-handed cholesteric liquid crystal layer; and wherein under the second operation state, an angle between the polarization axis of the pixel units of the first GH liquid crystal cell and an optical axis of the first ¼ wave plate is substantially 135°, and an angle between the polarization axis of the pixel units of the second GH liquid crystal cell and an optical axis of the second ¼ wave plate is substantially 135°.

According to another aspect of the present disclosure, a display device is provided, which comprises a display panel as described above.

The present disclosure has the following advantageous effects.

In the above technical solutions, the display panel comprises an optical component and two GH liquid crystal cells located at two opposite sides of the optical component. The optical component is used for reflecting light with a specific wavelength and transmitting other light. The GH liquid crystal cells each comprises a plurality of pixel units each having two operation states of transmitting natural light and linearly polarized light. When the pixel units transmit the linearly polarized light, the light reflected by the optical component cannot pass through the pixel units, thereby achieving a dark state display. When the pixel units transmit the natural light, the light transmitted from one side of the optical component may also be used for display at the other side, which improves utilization of light and increases display brightness and contrast. Since a polarizer is not used any more, costs may be significantly saved and manufacture process may be simplified. When the display panel is used outdoors, ambient natural light may be used for display, which has advantages of energy saving and environmental protection.

BRIEF DESCRIPTION OF THE DRAWINGS

In order to illustrate embodiments of the present disclosure or technical solutions in the prior art more clearly, drawings to be used for description of the embodiments or the prior art will be introduced briefly. Obviously, the following drawings only show some embodiments of the present disclosure. The skilled in the art may also obtain other drawings based on these drawings without any creative labor.

DETAILED DESCRIPTION OF THE PREFERRED EMBODIMENTS

Figure 1:
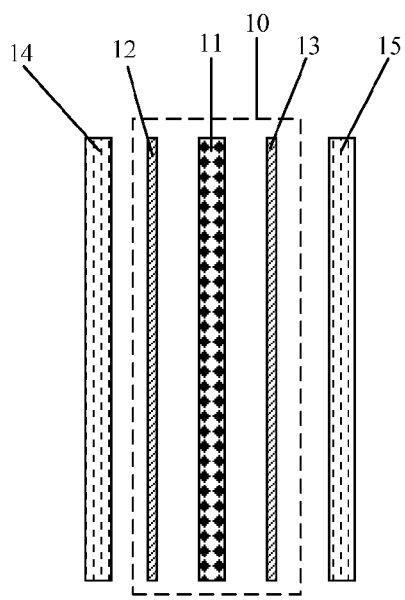
FIG. 1 shows a first explosive schematic view of a display panel along a screw axis of a cholesteric liquid crystal layer in an embodiment of the present disclosure.

Embodiments of the present disclosure are further described in conjunction with the drawings and examples hereinafter. The following examples are only for describing the present disclosure, and not meant to limit the scope of the present disclosure.

To make the objects, solutions and advantages of the present disclosure more obvious, technical solutions of the embodiments of the present disclosure will be illustrated in detail in the following in conjunction with the drawings of the embodiments. Apparently, the described embodiments are only some but not all of the embodiments of the present disclosure. All the other embodiments obtained by those skilled in the art based on the described embodiments of the present disclosure fall within the scope of protection of the present disclosure.

Technical terms or scientific terms used here should have a common meanings understood by those ordinary skilled in the art. Words such as "first" and "second" used in the specification and the claims of this patent application do not indicate any order, quantity or importance, and are only used to distinguish different components, unless defined otherwise. Similarly, words such as "one" and "a/an" do not indicate any numeral limitation either, but at least one existing. Words such as "connected to" or "connected with" do not limited to physical or mechanical connection necessarily, but can include electrical connection, either direct or indirect. Words such as "upper", "lower", "left" and "right" only used to indicate the relative position relation, and if the absolute position of the described object changes, the relative position relation changes accordingly.

The present disclosure provides a two-side reflective display panel, including two display surfaces opposite to each other. The pixel units arranged on the display surfaces of respective sides have two operation states, i.e., transmitting natural light and transmitting linearly polarized light. When the pixel units transmit the linearly polarized light, the light reflected by the optical component cannot pass through the pixel units, thereby achieving a dark state display. When the pixel units transmit the natural light, the light which is not used for the display surface at one side may be transmitted to the display surface at the other side for display, which improves utilization of light and increases display brightness and contrast. Since a polarizer is not used any more, costs may be significantly saved and manufacture process may be simplified. When the display panel is used outdoors, ambient natural light may be used for display, which has advantages of energy saving and environmental protection.

Embodiments of the present disclosure are further described in conjunction with the drawings and examples hereinafter. The following examples are only for describing the present disclosure, and not meant to limit the scope of the present disclosure.

Before the detailed description, several professional terms concerned in the present disclosure will be explained first.

Guest Host (GH) liquid crystal: mixing one or more dyes (guests) into the liquid crystal (host), wherein both dye molecules and liquid crystal molecules are molecules with rod-like structures. The rod-like dye molecules (e.g., positive dye molecules being considered in the present disclosure) have larger absorption amount for the polarized light in a major axis direction, but have a smaller absorption amount for the polarized light in a minor axis direction. These are important characteristics for the dye molecules. It is desired that difference between the absorption amounts for the dye molecules which are mixed into the liquid crystal is the larger the better. Furthermore, when the liquid crystal molecules are deflected by applying a voltage signal, a pointing direction of the dye molecules may be changed. When the major axis of the liquid crystal molecules is substantially perpendicular to a light incident direction, the linearly polarized light from the natural light which is substantially perpendicular to the major axis direction of the GH liquid crystal molecules is passed through. When the major axis of the liquid crystal molecules is substantially in parallel with the light incident direction, it is still the natural light that is passed through the GH liquid crystal layer.

Cholesteric liquid crystal: having a spiral structure, particularly having a right-handed circular polarization state and a left-handed circular polarization state. In order to facilitate the description, it is provisioned that facing the light, the light rotating counterclockwise is the right-handed circularly polarization state, and the light rotating clockwise is the left-handed circular polarization state. For cholesteric liquid crystal of the right (left)-handed polarization state, the cholesteric liquid crystal will reflect the right (left)-handed circularly polarized light, and transmit the circularly polarized light of the left (right)-handed polarization state, and the reflected right (left)-handed circularly polarized light will be reflected out in the left (right)-handed circular polarization state. The linearly polarized light may be converted into the circularly polarized light by a ¼ wave plate. When the linearly polarized light in an x-direction (or a y-direction, the x-direction being perpendicular to the y-direction) is converted into the right-handed circularly polarized light through the ¼ wave plate, and the right-handed circularly polarized light reaches the right-handed cholesteric liquid crystal, it will be reflected back in a form of the left-handed circular polarization state, and the left-handed circularly polarized light is turned into the linear polarization state in the y-direction (or the x-direction) through the ¼ wave plate. By using the spiral structure of the cholesteric liquid crystal, light with a specific wavelength may be selectively reflected, and other light may be transmitted, thus presenting a particular color.

Reflective display panel: displaying with the reflective light, such as the GH liquid crystal panel, the cholesteric liquid crystal panel.

First Embodiment

As shown in FIG. 1, an embodiment of the present disclosure provides a two-side reflective display panel including two display surfaces opposite to each other, which may implement the two-side reflective display.

The display panel comprises an optical component 10, and a first GH liquid crystal cell 14 and a second GH liquid crystal cell 15 located at two opposite sides of the optical component 10. The optical component 10 is used for reflecting light with a specific wavelength and transmitting other light. The first GH liquid crystal cell 14 and the second GH liquid crystal cell 15 each comprises a plurality of pixel units, each pixel unit having a first operation state and a second operation state. Under the first operation state, the pixel units transmit natural light. Under the second operation state, the pixel units transmit linearly polarized light, and at this time, the linearly polarized light substantially perpendicular to polarization axes of the pixel units cannot transmit the pixel units. This feature is used in the present disclosure to implement the dark state display. That is, when the pixel units are under the second operation state, the deflection of the light reflected by the optical component cannot pass through the pixel units, thereby achieving the dark state display. When the pixel units are under the first operation state, the light reflected by the optical component 10 transmits the pixel units on the display surface at one side to achieve a bright state display, while the light transmitted by the optical component 10 may be used for display on the display surface at the other side.

The structures of the first GH liquid crystal cell and the second GH liquid crystal cell may be the same. Of course, the structures of the first GH liquid crystal cell and the second GH liquid crystal cell may also be different. The present disclosure is not limited to this. For example, they may particularly comprise a first substrate and a second substrate for the cells, the GH liquid crystal molecule layer being arranged between the first substrate and the second substrate. A common electrode is arranged at the inside of the first substrate (which is opposite to the second substrate), and a pixel electrode is arranged at the inside of the second substrate (which is opposite to the first substrate). Each pixel unit of the first GH liquid crystal cell and the second GH liquid crystal cell includes one pixel electrode, and the pixel electrodes of the adjacent pixel units are electrically insulated. The pixel electrodes and the common electrode are used for controlling deflection of the GH liquid crystal molecules, so as to switch the corresponding pixel units to the first operation state or the second operation state.

In the above technical solution, when the pixel units transmit the natural light in the first operation state, the light which is not used for the display surface at one side may be transmitted to the display surface at the other side for display, which improves utilization of light and increases display brightness and contrast. Since a polarizer is not used any more, costs may be significantly saved and manufacture process may be simplified. When the display panel is used outdoors, ambient natural light may be used for display, which has advantages of energy saving and environmental protection.

In a particular implementation, the optical component 10 includes a cholesteric liquid crystal layer 11; a first ¼ wave plate 12 between the first GH liquid crystal cell 14 and the cholesteric liquid crystal layer 11 and a second ¼ wave plate 13 between the second GH liquid crystal cell 15 and the cholesteric liquid crystal layer 11 in an extension direction of a screw axis of the cholesteric liquid crystal layer 11. The first ¼ wave plate 12 and the second ¼ wave plate 13 are used for converting the linearly polarized light (which is particularly the linearly polarized light transmitted by the pixel units of the GH liquid crystal cell in the second operation state) into circularly polarized light which has the same optical rotation characteristic as that of the cholesteric liquid crystal layer 11.

Thus, the particular operation principle of the two-side reflective display panel is as follows.

Figure 3:
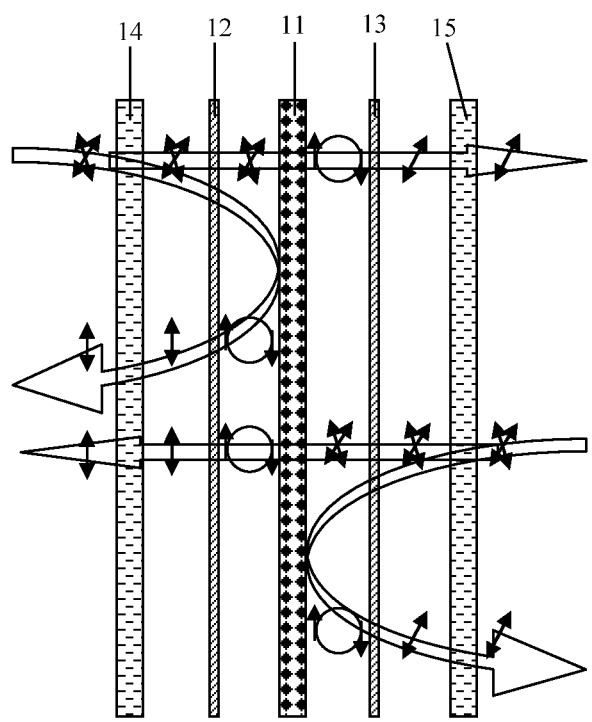
FIGS. 3-6 show display optical path diagrams of pixel units of a display panel under different operation states in an embodiment of the present disclosure.

As shown in FIG. 3, when the pixel units of the first GH liquid crystal cell 14 and the second GH liquid crystal cell 15 transmit the natural light in the first operation state, the light passing through the ¼ wave plate is still the natural light. Next, when the natural light reaches the cholesteric liquid crystal layer 11, the light with a certain wavelength will be reflected, and other light will be transmitted. According to characteristics of the cholesteric liquid crystal, the optical rotation characteristics of the light reflected and the light transmitted by the cholesteric liquid crystal layer 11 are different from those of the cholesteric liquid crystal layer 11. In particular, for a right-handed cholesteric liquid crystal layer 11, when the natural light reaches the cholesteric liquid crystal layer 11, both the reflected light and the transmitted light are left-handed circularly polarized light. The light reflected by the cholesteric liquid crystal layer 11 passes through the ¼ wave plate and the pixel units of the GH liquid crystal cells sequentially, so as to implement the bright state display. The light transmitted by the cholesteric liquid crystal layer 11 is used for display of the opposite display surface, improving utilization of light and increasing display brightness and contrast.

Figure 4:
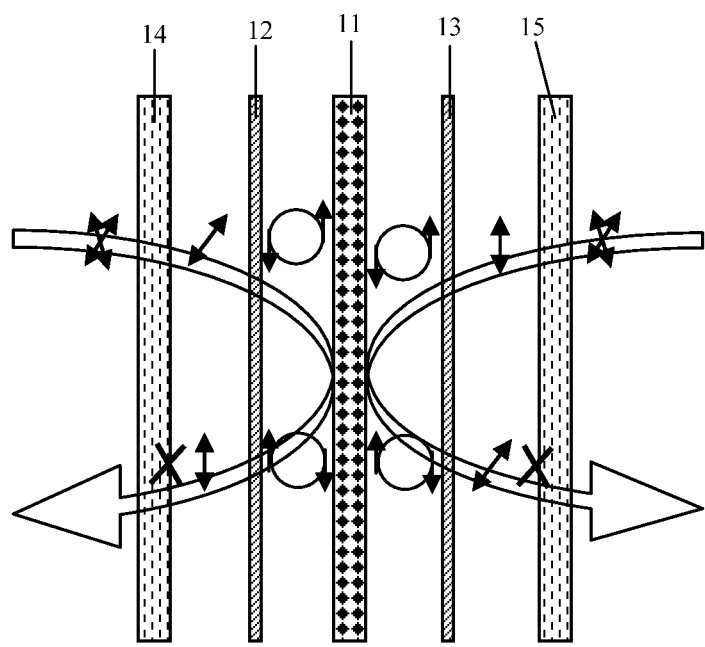

As shown in FIG. 4, when the pixel units of the first GH liquid crystal cell 14 and the second GH liquid crystal cell 15 transmit first linearly polarized light of a first direction in the second operation state, the first linearly polarized light is converted by the ¼ wave plate into the circularly polarized light which has the same optical rotation characteristic as that of the cholesteric liquid crystal layer 11. The circularly polarized light is reflected back when reaching the cholesteric liquid crystal layer 11, and there is no light passing through the cholesteric liquid crystal layer 11 to arrive at the opposite side. The light reflected back by the cholesteric liquid crystal layer 11 passes through the above ¼ wave plate again to be converted into second linearly polarized light of a second direction. The first direction and the second direction are substantially perpendicular to each other. Therefore, the polarized light of the second linearly polarized light cannot pass through the pixel units of the GH liquid crystal cell, which achieves the dark state display.

Further, in order that the display states of the pixel units corresponding to the first GH liquid crystal cell 14 and the second GH liquid crystal cell 15 are different, i.e., one is the bright state display and the other is the dark state display, the polarization axes of the pixel units in the first GH liquid crystal cell 14 and the second GH liquid crystal cell 15 are substantially perpendicular to each other.

Figure 2:
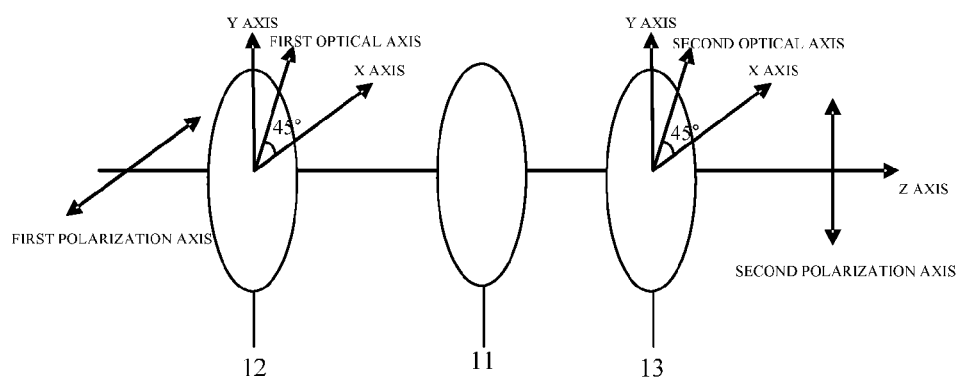
FIG. 2 shows a display schematic view of a display panel according to an embodiment of the present disclosure.
Figure 5:
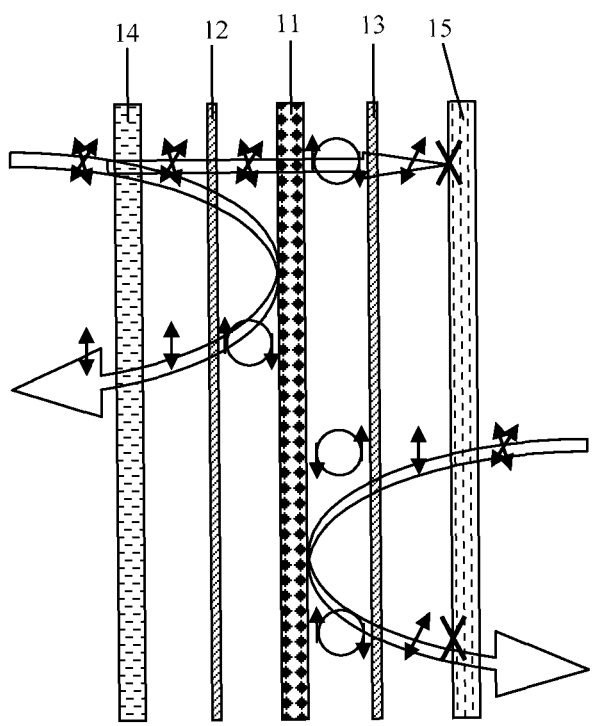
Figure 6:
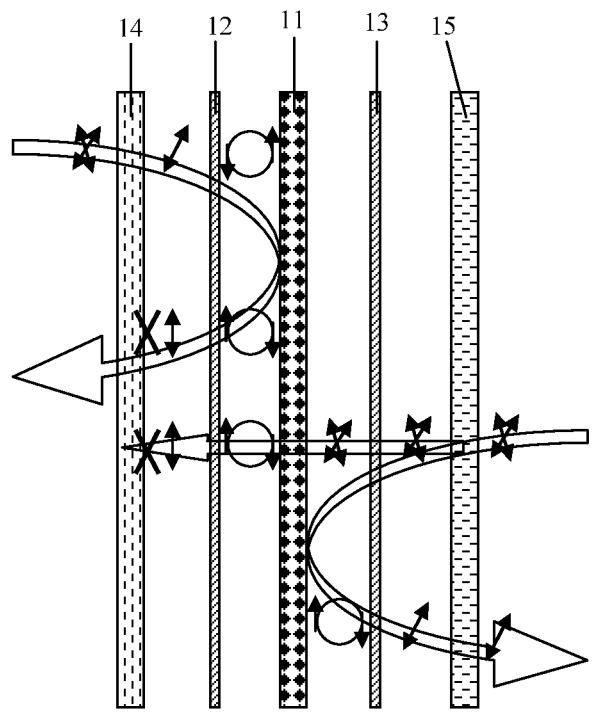

In particular, in connection with FIGS. 2, 5 and 6, when the pixel units transmit the linearly polarized light, an extension direction of a first polarization axis of the pixel units in the first GH liquid crystal cell 14 is set as an x-direction, and an extension direction of a second polarization axis of the pixel units in the second GH liquid crystal cell 15 is set as a y-direction. When the cholesteric liquid crystal layer 11 is the right-handed cholesteric liquid crystal layer, an angle between a first optical axis of the first ¼ wave plate 12 and the x-direction is substantially set as 45°, and also an angle between a second optical axis of the second ¼ wave plate 13 and the y-direction is substantially set as 45°. As shown in FIG. 2, the linearly polarized light of the x-direction transmitted by the pixel units of the first GH liquid crystal cell 14 is enabled to be converted into the right-handed circularly polarized light by the first ¼ wave plate 12, and the linearly polarized light of the y-direction transmitted by the pixel units of the second GH liquid crystal cell 15 is enabled to be converted into the right-handed circularly polarized light by the second ¼ wave plate 13.

As shown in FIG. 5, when the pixel units of the first GH liquid crystal cell 14 transmits the natural light in the first operation state, this is the bright state display. When the pixel units of the second GH liquid crystal cell 15 transmit the polarized light of the y-direction in the second operation state, this is the dark state display. The light passing through the pixel units of the first GH liquid crystal cell 14, the first ¼ wave plate 12 and the cholesteric liquid crystal layer 11 sequentially is the left-handed circularly polarized light, and the left-handed circularly polarized light is converted into the linearly polarized light of the x-direction by the second ¼ wave plate 13, which cannot pass through the pixel units of the second GH liquid crystal cell 15. Therefore, the bright state display of the pixel units in the first GH liquid crystal cell 14 would not affect the dark state display of the pixel units in the second GH liquid crystal cell 15.

As shown in FIG. 6, when the pixel units of the second GH liquid crystal cell 15 transmits the natural light in the first operation state, this is the bright state display. When the pixel units of the first GH liquid crystal cell 14 transmit the polarized light of the x-direction in the second operation state, this is the dark state display. The light passing through the pixel units of the second GH liquid crystal cell 15, the second ¼ wave plate 13 and the cholesteric liquid crystal layer 11 sequentially is the left-handed circularly polarized light, and the left-handed circularly polarized light is converted into the linearly polarized light of the y-direction by the first ¼ wave plate 12, which cannot pass through the pixel units of the first GH liquid crystal cell 14. Therefore, the bright state display of the pixel units in the second GH liquid crystal cell 15 would not affect the dark state display of the pixel units in the first GH liquid crystal cell 14.

When the cholesteric liquid crystal layer 11 is the left-handed cholesteric liquid crystal layer, the angle between the first optical axis of the first ¼ wave plate 12 and the x-direction is substantially set as 135°, and also the angle between the second optical axis of the second ¼ wave plate 13 and the y-direction is substantially set as 135°, so that the linearly polarized light of the x-direction transmitted by the pixel units of the first GH liquid crystal cell 14 can be converted into the left-handed circularly polarized light by the first ¼ wave plate 12, and the linearly polarized light of the y-direction transmitted by the pixel units of the second GH liquid crystal cell 15 can be converted into the left-handed circularly polarized light by the second ¼ wave plate 13. In this way, different display states of the pixel units of the first GH liquid crystal cell 14 and the second GH liquid crystal cell 15 may also be implemented, which is similar with the above description, and thus is omitted for simplicity.

As shown in FIG. 3, according to the above description, when the pixel units corresponding to the first GH liquid crystal cell 14 and the second GH liquid crystal cell 15 are bright state display, for the display surface at one side, the light transmitted by each pixel unit for display may include: the light reflected by the cholesteric liquid crystal layer in addition to the light reflected by the cholesteric liquid crystal layer among the light transmitted from the other side, which is equivalent to the natural light. When the natural light is white light, the display panel according to the present disclosure may present a black-white display. Further, in order to implement a colorful display, a filtering layer may be set at one side of the GH liquid crystal cell opposite to the cholesteric liquid crystal layer 11.

Figure 7:
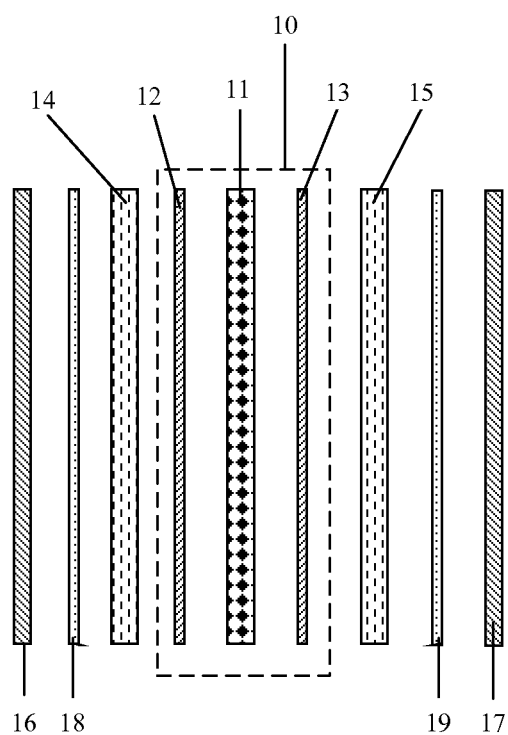
FIG. 7 shows a second explosive schematic view of a display panel along a screw axis of a cholesteric liquid crystal layer in an embodiment of the present disclosure.

Preferably, as shown in FIG. 7, a first front light source 16 is arranged at one side of the first GH liquid crystal cell 14 opposite to the cholesteric liquid crystal layer 11, and a second front light source 17 is arranged at one side of the second GH liquid crystal cell 15 opposite to the cholesteric liquid crystal layer 11. When the ambient natural light is not bright enough, the first front light source 16 and the second front light source 17 may be turned on, so that a normal display may also be implemented.

Further, a first asymmetric scattering film 18 may be arranged between the first front light source 16 and the first GH liquid crystal cell 14, and a second asymmetric scattering film 19 may be arranged between the second front light source 17 and the second GH liquid crystal cell 15. The operation principle of the asymmetric scattering films is that when the incident light passes through one of the asymmetric scattering films, it has a weak scattering effect; while when the light being reflected passes through the asymmetric scattering film again, it has a strong scattering effect. The present disclosure may significantly improve a visual angle and a display effect of the display panel by using the asymmetric scattering films.

Second Embodiment

The present disclosure further provides a display device, including the display panel according to the first embodiment, which can implement the two-side reflective display, and improve the utilization of the light, the display brightness and contrast. Also, the production costs may be reduced, and the manufacture process may be simplified, which has advantages of energy saving and environmental protection.

The above are merely the preferred embodiments of the present invention. It should be appreciated that, a person skilled in the art may make further improvements and modifications without departing from the principle of the present invention, and these improvements and modifications shall also be considered as the scope of the present invention.

What is claimed is:
1. A display panel, comprising:
 an optical component for reflecting light with a specific wavelength and transmitting other light; and
 a first Guest Host (GH) liquid crystal cell and a second GH liquid crystal cell located at two opposite sides of the optical component, the first GH liquid crystal cell and the second GH liquid crystal cell each comprising a plurality of pixel units which have a first operation state and a second operation state, the pixel units transmitting natural light under the first operation state and transmitting linearly polarized light under the second operation state, wherein when the pixel units are under the second operation state, a polarization direction of the light reflected by the optical component is substantially perpendicular to an extension direction of a polarization axis of the pixel units, thereby achieving a dark state display.

2. The display panel according to claim 1, wherein the optical component comprises:
a cholesteric liquid crystal layer in a planar state for reflecting the light with the specific wavelength and transmitting the other light;
a first ¼ wave plate between the first GH liquid crystal cell and the cholesteric liquid crystal layer in an extension direction of a screw axis of the cholesteric liquid crystal layer; and
a second ¼ wave plate between the second GH liquid crystal cell and the cholesteric liquid crystal layer in the extension direction of the screw axis of the cholesteric liquid crystal layer,
wherein the first ¼ wave plate and the second ¼ wave plate are used for converting the linearly polarized light into circularly polarized light which has the same optical rotation characteristic as that of the cholesteric liquid crystal layer.

3. The display panel according to claim 1, wherein under the second operation state, the polarization axes of the pixel units in the first GH liquid crystal cell and the second GH liquid crystal cell are substantially perpendicular to each other.

4. The display panel according to claim 2, wherein a first front light source is arranged at one side of the first GH liquid crystal cell opposite to the cholesteric liquid crystal layer.

5. The display panel according to claim 4, wherein a first asymmetric scattering film is arranged between the first front light source and the first GH liquid crystal cell.

6. The display panel according to claim 5, wherein a second front light source is arranged at one side of the second GH liquid crystal cell opposite to the cholesteric liquid crystal layer.

7. The display panel according to claim 6, wherein a second asymmetric scattering film is arranged between the second front light source and the second GH liquid crystal cell.

8. The display panel according to claim 1, wherein structures of the first GH liquid crystal cell and the second GH liquid crystal cell are identical, each comprising:
a first substrate and a second substrate arranged opposite to form the cell;
a GH liquid crystal molecular layer arranged between the first substrate and the second substrate;
wherein a common electrode is arranged inside the first substrate, a pixel electrode is arranged inside the second substrate, each of the pixel units in the first GH liquid crystal cell and the second GH liquid crystal cell comprises one pixel electrode, the pixel electrodes of adjacent pixel units are electrically insulated, and the pixel electrodes and the common electrode are used for controlling deflection of the GH liquid crystal molecules, so as to switch the corresponding pixel units to the first operation state or the second operation state.

9. The display panel according to claim 2, wherein the cholesteric liquid crystal layer is a right-handed cholesteric liquid crystal layer; and wherein under the second operation state, an angle between the polarization axis of the pixel units of the first GH liquid crystal cell and an optical axis of the first ¼ wave plate is substantially 45°, and an angle between the polarization axis of the pixel units of the second GH liquid crystal cell and an optical axis of the second ¼ wave plate is substantially 45°.

10. The display panel according to claim 2, wherein the cholesteric liquid crystal layer is a left-handed cholesteric liquid crystal layer; and wherein under the second operation state, an angle between the polarization axis of the pixel units of the first GH liquid crystal cell and an optical axis of the first ¼ wave plate is substantially 135°, and an angle between the polarization axis of the pixel units of the second GH liquid crystal cell and an optical axis of the second ¼ wave plate is substantially 135°.

11. A display device comprising at least a display panel, the display panel comprising:
an optical component for reflecting light with a specific wavelength and transmitting other light; and
a first Guest Host (GH) liquid crystal cell and a second GH liquid crystal cell located at two opposite sides of the optical component, the first GH liquid crystal cell and the second GH liquid crystal cell each comprising a plurality of pixel units which have a first operation state and a second operation state, the pixel units transmitting natural light under the first operation state and transmitting linearly polarized light under the second operation state,
wherein when the pixel units are under the second operation state, a polarization direction of the light reflected by the optical component is substantially perpendicular to an extension direction of a polarization axis of the pixel units, thereby achieving a dark state display.

12. The display device according to claim 11, wherein the optical component comprises:
a cholesteric liquid crystal layer in a planar state for reflecting the light with the specific wavelength and transmitting the other light;
a first ¼ wave plate between the first GH liquid crystal cell and the cholesteric liquid crystal layer in an extension direction of a screw axis of the cholesteric liquid crystal layer; and
a second ¼ wave plate between the second GH liquid crystal cell and the cholesteric liquid crystal layer in the extension direction of the screw axis of the cholesteric liquid crystal layer,
wherein the first ¼ wave plate and the second ¼ wave plate are used for converting the linearly polarized light into circularly polarized light which has the same optical rotation characteristic as that of the cholesteric liquid crystal layer.

13. The display device according to claim 11, wherein under the second operation state, the polarization axes of the pixel units in the first GH liquid crystal cell and the second GH liquid crystal cell are substantially perpendicular to each other.

14. The display device according to claim 12, wherein a first front light source is arranged at one side of the first GH liquid crystal cell opposite to the cholesteric liquid crystal layer.

15. The display device according to claim 14, wherein a first asymmetric scattering film is arranged between the first front light source and the first GH liquid crystal cell.

16. The display device according to claim 15, wherein a second front light source is arranged at one side of the second GH liquid crystal cell opposite to the cholesteric liquid crystal layer.

17. The display device according to claim 16, wherein a second asymmetric scattering film is arranged between the second front light source and the second GH liquid crystal cell.

18. The display panel according to claim 11, wherein structures of the first GH liquid crystal cell and the second GH liquid crystal cell are identical, each comprising:
- a first substrate and a second substrate arranged opposite to form the cell;
- a GH liquid crystal molecular layer arranged between the first substrate and the second substrate;
- wherein a common electrode is arranged inside the first substrate, a pixel electrode is arranged inside the second substrate, each of the pixel units in the first GH liquid crystal cell and the second GH liquid crystal cell comprises one pixel electrode, the pixel electrodes of adjacent pixel units are electrically insulated, and the pixel electrodes and the common electrode are used for controlling deflection of the GH liquid crystal molecules, so as to switch the corresponding pixel units to the first operation state or the second operation state.

19. The display device according to claim 12, wherein the cholesteric liquid crystal layer is a right-handed cholesteric liquid crystal layer; and wherein under the second operation state, an angle between the polarization axis of the pixel units of the first GH liquid crystal cell and an optical axis of the first ¼ wave plate is substantially 45°, and an angle between the polarization axis of the pixel units of the second GH liquid crystal cell and an optical axis of the second ¼ wave plate is substantially 45°.

20. The display device according to claim 12, wherein the cholesteric liquid crystal layer is a left-handed cholesteric liquid crystal layer; and wherein under the second operation state, an angle between the polarization axis of the pixel units of the first GH liquid crystal cell and an optical axis of the first ¼ wave plate is substantially 135°, and an angle between the polarization axis of the pixel units of the second GH liquid crystal cell and an optical axis of the second ¼ wave plate is substantially 135°.

\* \* \* \* \*